US009217200B2

(12) United States Patent
Haukka et al.

(10) Patent No.: US 9,217,200 B2
(45) Date of Patent: Dec. 22, 2015

(54) MODIFICATION OF NANOIMPRINT LITHOGRAPHY TEMPLATES BY ATOMIC LAYER DEPOSITION

(75) Inventors: Suvi P. Haukka, Helsinki (FI); Kai-Erik Elers, Vantaa (FI)

(73) Assignee: ASM INTERNATIONAL N.V., Bilthoven (NL)

( * ) Notice: Subject to any disclaimer, the term of this patent is extended or adjusted under 35 U.S.C. 154(b) by 945 days.

(21) Appl. No.: 11/963,448

(22) Filed: Dec. 21, 2007

(65) Prior Publication Data

US 2011/0146568 A1 Jun. 23, 2011

(51) Int. Cl.
*C23C 16/00* (2006.01)
*C23C 16/455* (2006.01)
*C23C 16/06* (2006.01)

(52) U.S. Cl.
CPC .......... *C23C 16/45555* (2013.01); *C23C 16/06* (2013.01); *C23C 16/45525* (2013.01)

(58) Field of Classification Search
CPC .......................... C23C 16/06; C23C 16/45525
USPC ...................................................... 427/248.1
See application file for complete search history.

(56) References Cited

U.S. PATENT DOCUMENTS

| 2002/0187256 | A1* | 12/2002 | Elers et al. | 427/99 |
|---|---|---|---|---|
| 2005/0084804 | A1* | 4/2005 | Truskett et al. | 430/311 |
| 2006/0012079 | A1* | 1/2006 | Jung et al. | 264/338 |
| 2006/0035164 | A1* | 2/2006 | Schaper | 430/200 |
| 2006/0145398 | A1* | 7/2006 | Bailey et al. | 264/338 |
| 2008/0315459 | A1* | 12/2008 | Zhang et al. | 264/338 |

OTHER PUBLICATIONS

Bailey et al., "Template Fabrication Schemes for Step and Flash Imprint Lithography", Microelectronic Engineering, 2002, pp. 61-62.
Bailey et al., "Step and Flash Imprint Lithography: Defect Analysis", J. Vac. Sci. Technology B, Nov./Dec. 2001.
Bailey et al., "Step and Flash Imprint Lithography: Template Surface Treatment and Defect Analysis", American Vacuum Society J. of Vac. Sci. & Technol. B, Nov./Dec. 2000, vol. 18, Issue 6.
Cardinale et al., "Fabrication of a Surface Acoustic Wave-Based Correlator Using Step and Flash Imprint Lithography", J. Vac. Sci. Technol. B, Nov./Dec. 2004.
Choi et al., Distortion and Overlay Performance of UV Step and Repeat Imprint Lithography, MNE Micro- and Nano- Engineering Conference, Sep. 2004.
Choi et al., "Design of Orientation Stages for Step and Flash Imprint Lithography", Journal of Int. Societies for Precision Engineering and Nanotechnology, Jul. 2001.
Choi et al., "Layer to Layer Alignment for Step and Flash Imprint Lithography", SPIE's 26th Int. Symp. Microlithography: Emerging Lithographic Technologies, Mar. 2001.
Choi et al., "Partially Constrained Compliant Stages for High Resolution Imprint Lithography", Proceedings of ASME 2000 Design Engineering Technical Conference, Sep. 2000.

(Continued)

*Primary Examiner* — Elizabeth Burkhart
(74) *Attorney, Agent, or Firm* — Knobbe, Martens, Olson & Bear LLP

(57) ABSTRACT

Methods of forming thin films on nanopatterning templates, such as nanoimprint lithography (NIL) templates are provided. In some embodiments, an atomic layer deposition (ALD) type process for modifying the surface of a NIL template comprises alternately and sequentially contacting a substrate in a reaction space with vapor phase pulses of two or more reactants.

26 Claims, 1 Drawing Sheet

(56) References Cited

OTHER PUBLICATIONS

Colburn et al., "Characterization and Modeling of Volumetric and Mechnanical Properties for Step and Flash Imprint Lithography Photopolymers", J. Vac. Sci. Technology B, Nov./Dec. 2001.
Colburn et al., "Development and Advantages of Step-and-Flash Lithography", Solid State Technology, Jul. 2001.
Colburn et al., "Step and Flash Imprint Lithography for sub-100nm Patterning", SPIE's 25th Intl. Symp. Microlithography: Emerging Lithographic Technologies III, Mar. 3, 2000.
Colburn et al., "Step and Flash Imprint Lithography: A New Approach to High-Resolution Patterning", Proceedings of SPIE's 24th International Symposium on Microlithography: Emerging Lithographic Technologies III, Mar. 1999, vol. 3676.
Dauksher et al., "Step and Flash Imprint Lithography Template Characterization, from an Etch Perspective", EIPBN Conference, Jun. 2003.
Dauksher et al., "Repair of Step and Flash Imprint Lithography Templates", J. Vac. Sci. Technol. B, Nov./Dec. 2004.
Dauksher et al., "Characterization of and Imprint Results Using Indium Tin Oxide-Based Step and Flash Imprint Lithography Templates", J. Vac. Sci. Technol. B, Nov./Dec. 2002.
Falcon et al., "Molecular Imprint: A Case Study on Success Through Strategic Industry and Academic Partnerships", Nanotechnology Law & Business, 2004, vol. 1.4.
Gehoski et al., "Evaluation of the Imprio 100 Step and Flash Imprint Lithography Tool", Feb. 2004.
Gehoski et al., "Indium Tin Oxide Template Development for Step and Flash Imprint Lithography", SPIE Microlithography Conference, Feb. 2005.
Hershey, "Imprinting Technique Offers Low-Cost Photonic Crystal LEDs", Compound Semiconductor, Oct. 2006.
Hershey et al., "2D Photonic Crystal Patterning for High Volume LED Manufacturing", SPIE Optics and Photonics Manuscript, Aug. 2006.
Hershey et al., "Imprint Lithography Advanced in LED Manufacturing", ISBLLED, 2006.
Hess et al., "Inspection of Templates for Imprint Lithography", J. Vac. Sci. Technol. B, Nov./Dec. 2004.
Higashiki, "Status and Future Lithography for Sub-hp32nm Device," (presentation), IEEE Lithography Workshop, Dec. 2007.
Jen et al., "Multi-Level Step and Flash Imprint Lithography for Direct Patterning of Dielectrics," (paper), SPIE Advanced Lithography Paper, Feb. 2007.
Jen et al., "Multi-Level Step and Flash Imprint Lithography for Direct Patterning of Dielectrics," (presentation), SPIE Advanced Lithography Presentation, Feb. 2007.
Johnson et al., "Effects of Etch Barrier Densification on Step and Flash Lithography", Journal of Vacuum Science and Technology, Nov. 2005.
Johnson et al., "Advances in Step and Flash Imprint Lithography", SPIE Microlithography Conference, Feb. 2003.
Le et al., "Development of an Etch-Definable Lift-Off Process for use with Step and Flash Imprint Lithography", SPIE Microlithography Conference, Feb. 2005.
Lentz et al., "Whole Wafer Imprint Patterning Using Step and Flash Imprint Lithography: A Manufacturing Solution for Sub 100nm Patterning," (poster), SPIE Advanced Lithography Paper, Feb. 2007.
Lentz et al., "Whole Wafer Imprint Patterning Using Step and Flash Imprint Lithography: A Manufacturing Solution for Sub 100nm Patterning," (paper), SPIE Advanced Lithography Paper, Feb. 2007.
Long et al., Materials for Steph and Flash Imprint Lithography (S-FIL), Journal of Materials Chemistry, Sep. 2007.
Mancini et al., "Step and Flash Imprint Lithography for Sub-80nm Contact Holes", Solid State Technology, Feb. 2004.
Mancini et al., "Analysis of Critial Dimension Uniformity for Step and Flash Imprint Lithography", SPIE Microlithography Conference, Feb. 2003.
Mancini et al., "Hydrogen Silsesquioxane for Direct Electron-Beam Patterning of Step and Flash Imprint Lithography Templates", J. Vac. Sci. Technol. B, Nov./Dec. 2002.
Martin et al., "Prediction of Fabrication Distortions in Step and Flash Imprint Lithography Templates", J. Vac. Sci. Technol. B, Nov./Dec. 2002.
McMackin et al., "Patterned Wafer Defect Density Analysis of Step and Flash Imprint Lithography", EIPBN Presentation, May 2007.
McMackin et al., "Design and Performance of a Step and Repeat Imprinting Machine", SPIE Microlithography Conference, Feb. 2003.
Melliar-Smith, "Lithography Beyond 32nm: A Role for Imprint?" (paper), SPIE Advanced Lithography Plenary Paper, Feb. 2007.
Murty et al., "S-FIL Technology: Cost of Ownership Case Study", SPIE Microlithography Conference, Feb. 2005.
Myron et al., "Defect Inspection for Imprint Lithography Using a Die to Database Electron Beam Verification System", SPIE Proceedings, 2006, vol. 6151.
Myron et al., "Advanced Mask Metrology Enabling Characterization of Imprint Lithography Templates", SPIE Microlithography Conference, Feb. 2005.
Nordquist et al., "Image Placement Issues for ITO-Based Step and Flash Imprint Lithography Templates", J. Vac. Sci. Technol. B, Mar./Apr. 2004.
Nordquist et al., "Critical Dimension and Images Placement Issues for Step and Flash Imprint Lithography Templates", 22nd Annual BACUS Symposium on Photomask Technology, Sep. 2002.
An Enabling Technology for Nanoscale Manufacturing: S-FIL, NSTI Nano Impact Summit, Oct. 2005.
Resnick et al., "Direct Die-to-Database Electron Beam Inspection of Fused Silica Imprint Templates", Journal of Vacuum Science and Technology B, Nov. 2006.
Resnick et al., "Step and Flash Imprint Lithography", Materials Today, Feb. 2005.
Resnick et al., "Making an Imprint", OE Magazine, Aug. 2003.
Resnick et al., "Imprint Lithography for Integrated Circuit Fabrication", EIPBN Conference, Jun. 2003.
Resnick et al., "Imprint Lithography: Lab Curiosity or the Real NGL?", SPIE Microlithography Conference, Feb. 2003.
Resnick et al., "High Resolution Templates for Step and Flash Imprint Lithography", J. Microlith., Microfab., Microsyst., Oct. 2002, vol. 1, Issue 3.
Resnick et al., "Release Layers for Contact and Imprint Lithography", Semiconductor International, Jun. 2002.
Resnick et al., "High Resolution Templates for Step and Flash Imprint Lithography", SPIE Microlithography Conference, Feb. 2002.
Resnick et al., "New Methods for Fabricating Step and Flash Imprint Lithography Templates", NIST-SPIE Conference on Nanotechnology, Sep. 2001.
Ruchhoeft et al., "Patterning Curved Surfaces: Template Generation by Ion Beam Proximity Lithography and Relief Transfer by Step and Flash Imprint Lithography", American Vacuum Society J. of Vac. Sci. Technol. B, Nov./Dec. 1999, vol. 17, Issue 6, pp. 2965-2969.
Schmid et al., "Implementation of an Imprint Damascene Process for Interconnect Fabrication", Journal of Vacuum Science and Technology B, Nov. 2006.
Schmid et al., "Step and Flash Imprint Lithography Templates for the 32nm Node and Beyond", MNE, Sep. 2006.
Selinidis et al., "Defect Reduction Progress in Step and Flash Imprint Lithography", SPIE Microlithography Conference, Feb. 2003.
Smith et al., "Employing Step and Flash Imprint Lithography for Gate Level Patterning of a MOSFET Device", SPIE Microlithography Conference, Feb. 2003.
Sreenivasan et al., "Nanotechnology Small Print", Small Print, 2004.
Stewart et al., "Direct Imprinting of Dielectric Materials for Dual Damascene Processing", SPIE Microlithography Conference, Feb. 2003.
Thompson et al., "Fabrication of Step and Flash Imprint Lithography Templates Using Commercial Mask Processes", SPIE Microlithography Conference, Feb. 2003.

(56) References Cited

OTHER PUBLICATIONS

Xu et al., "Development of Imprint Materials for the Step and Flash Imprint Lithography Process", SPIE Microlithography Conference, Feb. 2004.

Yodenda et al., "Nanoimprint Applications Toward 22nm node CMOS Devices," (presentation), MNE, Sep. 2007.

Yoshitake et al., "The Development of Full Field High Resolution Imprint Templates," (paper), BACUS, Sep. 2007.

* cited by examiner

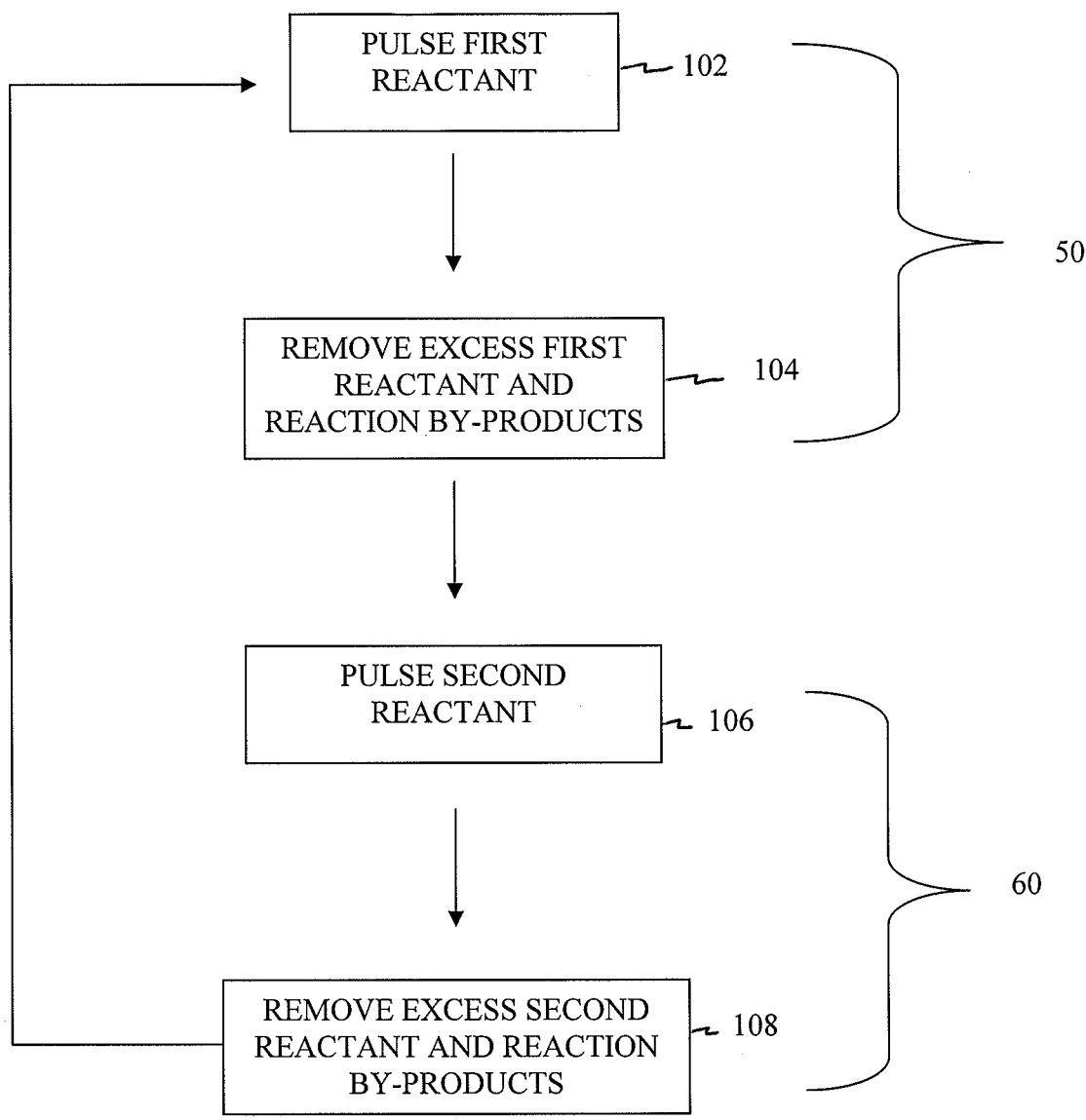

MODIFICATION OF NANOIMPRINT LITHOGRAPHY TEMPLATES BY ATOMIC LAYER DEPOSITION

BACKGROUND

1. Field

The present invention relates to the use of atomic layer deposition to modify the surface of substrates used in nanoimprint lithography

2. Description of the Related Art

Atomic layer deposition (ALD), originally known as atomic layer epitaxy (ALE), is an advanced form of vapor deposition. ALD processes are based on sequential, self-saturated surface reactions. Examples of these processes are described in detail in U.S. Pat. Nos. 4,058,430 and 5,711,811. Due to the self-saturating nature of the process, ALD enables almost perfectly conformal deposition of films on an atomic level and precise control of the thickness and composition of the deposited films.

In semiconductor and optical applications, there is an increasing need for nanopatterning techniques. Typically, UV lithography is used. However, nanoimprint lithography (NIL) has recently gained a lot of interest as a low cost, high throughput and high resolution process. In NIL, mechanical deformation of an imprint resist is used to create a pattern for subsequent processing.

SUMMARY OF THE INVENTION

According to one aspect of the invention, methods for depositing a thin film on a nanoimprint lithography template by atomic layer deposition are provided. The methods generally comprise contacting a template in a reaction space with a first reactant that includes a first source chemical and a second, thereby forming the thin film on the template.

According to some embodiments of the invention, atomic layer deposition (ALD) processes for growing a thin film over a template comprise alternately and sequentially contacting a template in a reaction space with vapor phase pulses of a first compound that forms no more than about one molecular layer on the structural surface of the template, and one or more additional reactants.

In some embodiments, the ALD deposited film smoothes the surface of the substrate. In other embodiments the ALD deposited film changes the adhesion of the template to the resist material, thus facilitating release of the pattern from the template. In other embodiments the ALD deposited film is used to increase the robustness of the template. For example, a film, such as a metal film, can be deposited on the substrate that is harder than the underlying template material. The ALD deposited film is transparent in some embodiments. In other embodiments it provides an anti-reflective coating.

In other embodiments, a metal resist is deposited over the template by ALD. The resist is subsequently released by a chemical or thermal process and applied to a substrate.

All of these embodiments are intended to be within the scope of the invention herein disclosed. These and other embodiments of the present invention will be readily apparent to those skilled in the art from the following detailed description of the preferred embodiments having reference to the attached FIGURE, the invention not being limited to any particular preferred embodiment(s) disclosed.

BRIEF DESCRIPTION OF THE DRAWINGS

The invention will be better understood from the Detailed Description of the Preferred Embodiments and from the appended drawing, which is meant to illustrate and not to limit the invention, and wherein:

FIG. 1 is a block diagram of a pulsing sequence in an ALD-type process according to some embodiments of the invention.

DETAILED DESCRIPTION OF CERTAIN EMBODIMENTS

In nanoimprint lithography (NIL), a template is typically used to create a desired pattern in an imprint resist. The surface of these templates can be modified to improve any of a variety of properties, such as smoothness, adhesion, and robustness. As described herein, an atomic layer deposition (ALD) type reaction can be used for controlled and conformal modification of the template surface. In addition, ALD can be used to form a metal pattern by depositing a metal over a template and subsequently releasing the pattern.

In some embodiments of the present invention, one or more thin films are formed over a NIL template in ALD-type processes by contacting the template with alternating and sequential pulses of a two or more vapor phase reactants. Although generally described herein in terms of the formation of thin films, in some cases surface modifications from one monolayer up to about a continuous film are formed over an NIL template by ALD.

The thin film formed (or surface modification) can serve any of a wide variety of purposes. In some embodiments the thin film increases the smoothness of the surface of the template. In other embodiments the thin film enhances the ability of the template to release the molded imprint layer. In other embodiments, the thin film may form a hard coating on the template surface to protect against mechanical wear or deformation that may occur with repeated use, or may be used as a moisture barrier or a corrosion protection layer. In still other embodiments, the thin film can serve as an anti-reflective layer that passes a desired wavelength of UV light, for example to cure an underlying imprint resist layer.

In some embodiments the thin film may be a nanolaminate. One of the layers of the nanolaminate may be contributed to the molded imprint layer after impression.

DEFINITIONS

In context of the present invention, an "ALD process" or "ALD type process" generally refers to a process for producing a film over a substrate monolayer (molecular layer) by monolayer using self-saturating chemical reactions. The general principles of ALD are disclosed, e.g., in U.S. Pat. Nos. 4,058,430 and 5,711,811, the disclosures of which are incorporated herein by reference. In an ALD process, gaseous reactants, i.e., precursors or source materials, are alternately and sequentially conducted into a reaction space where they contact a substrate to provide a surface reaction. Reaction conditions are selected such that only up to one monolayer (i.e. an atomic layer or a molecular layer) of material is deposited at a time during each pulsing cycle. Gas phase reactions between precursors and any undesired reactions of byproducts are inhibited because precursor pulses are physically separated from each other in time and/or space and the reaction chamber is purged with an inactive gas (e.g. nitrogen, argon, or hydrogen) and/or evacuated using, e.g., a pumping system, between precursor pulses to remove surplus gaseous reactants and reaction byproducts from the chamber. Thus, the concentration profiles of the reactants in the reaction space with respect to time are not overlapping.

"Reaction space" is used to designate a reactor or reaction chamber ("chamber"), or an arbitrarily defined volume therein, in which conditions can be adjusted to effect film growth.

"Adsorption" is used to designate a chemical attachment of atoms or molecules on a surface.

"Film" means a film that is grown on a substrate from elements or compounds that are transported as separate ions, atoms or molecules from a source to the substrate. The thickness of the film will depend upon the application and may vary in a wide range, preferably from one atomic layer to 1,000 nanometers (nm) or more. In some embodiments, the film is less than about 20 nm in thickness, even more preferably less than about 10 nm, and most preferably less than about 5 nm. In some embodiments surface modifications with thicknesses from about one molecular layer up to a nearly continuous film are formed.

"Plasma-excited species" is used to designate one or more excited species formed via application of energy to a gas comprising one or more precursors. Energy may be applied (or coupled) to the gas via any of a variety of methods, such as inductive coupling, ultraviolet radiation, microwaves, capacitive coupling, application of RF power, etc. In the absence of coupling energy, plasma generation is terminated. Plasma-excited species may be formed within a reaction space (i.e., direct or in situ plasma generation) comprising a substrate or externally in a remote plasma generator. Plasma-excited species include radicals, atomic species, cations and anions of the precursor and derivatives formed during plasma generation, such as, e.g., cracking fragments. For example, plasma-excited species of ethane ($C_2H_6$) may include methyl radical ($CH_3^*$), ethyl radical ($C_2H_5^*$), methyl cation ($CH_3^+$) and ethyl cation ($C_2H_5^+$). Atomic gases in their ground state, such as hydrogen and oxygen, of normally diatomic gases ($H_2$ and $O_2$), may also be used in some embodiments and are considered "plasma-excited species" for the purposes of the present disclosure, although they are not necessarily excited.

Atomic Layer Deposition (ALD) Methods

ALD is a self-limiting process, whereby sequential and alternating pulses of reaction precursors are used to deposit a molecular layer of material per deposition cycle. The deposition conditions and precursors are selected to ensure self-saturating reactions, such that an adsorbed layer in one pulse generally leaves a surface termination that is non-reactive with the gas phase reactants of the same pulse. A subsequent pulse of different reactants reacts with the previous termination to enable continued deposition. Thus, each cycle of alternated pulses leaves no more than about one molecular layer of the desired material. The principles of ALD type processes have been presented, for example, by T. Suntola in, e.g. the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference.

In a typical ALD-type process for depositing films, one deposition cycle comprises: exposing the substrate to a first reactant; removing any unreacted first reactant and reaction byproducts, if any, from the reaction space; exposing the substrate to a second reactant; and removing any unreacted second reactant and reaction byproducts, if any, from the reaction space. The first reactant may be, for example, a metal precursor. Typically, halide reactants, such as, e.g., $TaF_5$, $TaCl_4$ and $HfCl_4$, are used as metal precursors in ALD deposition because these precursors are inexpensive and relatively stable, but at the same time reactive towards different types of surface groups. Also, metalorganic precursors, such as trimethylaluminum, metal cyclopentadienyl precursors, metal betadiketonates, metal alkoxides and amino-substituted metal precursors may be used as first reactants. Further, silicon precursors, such as amino-, alkoxy- or alkyl-substituted silanes and silazanes may also be used as a first reactant. The second reactant may be, for example, $H_2O$, $O_3$, $O_2$, $O^*$, $O$, $NH_3$, $H$, $H^*$, $N_2/H_2$-plasma, silanes, metalorganics such as trimethylaluminum (TMA) and triethyl boron (TEB) or alkoxides, amino-, alkoxy-, or alkyl-substituted silanes and silazanes such as diethyl silane, and boranes, including substituted boranes.

The separation of precursors by inert gases prevents gas-phase reactions between reactants and enables self-saturating surface reactions. Because the reactions self-saturate, strict temperature control of the substrates and precise dosage control of the precursors is not required. However, the substrate temperature is preferably such that an incident gas species does not condense or decompose on the substrate surface. Surplus chemicals and reaction byproducts, if any, are typically removed from the reaction space before the next reactive chemical pulse is introduced into the chamber. Undesired gaseous molecules can be effectively removed from the reaction space with the help of an inert purging gas and/or by evacuating with a pump. The purging gas directs the superfluous molecules out of the chamber, generally at the same time that gases are removed from the reaction space by pumping.

According to preferred embodiments of the invention, an ALD-type process is used to form one or more thin films on a NIL template. In some embodiments a compound thin film, such as an oxide, nitride, carbide or mixture thereof, is formed in an ALD cycle comprising at least two distinct phases. In a first phase of the deposition cycle ("the first phase"), a first reactant comprising a metal (or semimetal, such as Si or Ge) is pulsed to the reaction space and chemisorbs onto the substrate surface, forming no more than about one molecular layer on the surface of the substrate. The first reactant is selected such that, under the preferred conditions, the amount of reactant can be bound to the surface is determined, at least in part, by the number of available binding sites and by the physical size of the chemisorbed species (including ligands). The chemisorbed layer left by a pulse of the first reactant is self-terminated with a surface that is non-reactive with the remaining chemistry of that pulse. This phenomenon is referred to herein as "self-saturation." One of skill in the art will recognize that the self-limiting nature of this phase makes the entire ALD cycle self-limiting.

In some embodiments the first reactant is a metal source material and preferably includes a metal species desired in the film being deposited. In some embodiments, the thin film comprises one or more metals selected from the group consisting of Ti, Zr, Hf, V, Nb, Ta, Cr, Mo, W, Mn, Re, Fe, Co, Ni, Cu, Ag, Au, Pd, Pt, Rh, Ir, Ru and Os. In some embodiments, the metal source chemical, also referred to herein as the "metal compound," is a halide and the adsorbed molecular layer is terminated with halogen ligands. The metal compound may be selected, for example, from the group consisting of metal bromides, metal chlorides, metal fluorides and metal iodides. As mentioned above, in some embodiments the metal compound can comprise a semimetal such as Si or Ge instead of, or in addition to, a metal.

In other embodiments, the first reactant is a metal organic compound, such as a metal dialkylamido, an alkoxide, a betadiketonate or a metal cyclopentadienyl compound. Metal dialkylamido compounds include, without limitation, $M(NR_2)_5$ and $M(NR)(NR_2)_3$, where M is a metal, R=$CH_3$ or $CH_2CH_3$, and $Ta(NR'R'')_5$, where R'=$CH_3$ and R''=$CH_2CH_3$.

Other exemplary first reactants include $TiCl_4$, $TaCl_5$, $HfCl_4$, $ZrCl_4$, $SiCl_4$, $AlCl_3$, trimethyl aluminum, $WF_6$, $MoF_6$, $Ru(EtCp)_2$, 2,4-(dimethylpentadienyl)(ethylcyclopentadienyl)ruthenium, amino silanes such as bis(diethylamino)silane or tris(diethylaminosilane), siloxanes and noble metal betadiketonates, such as iridium, platinum or ruthenium betadiketonates.

Excess first reactant and reaction byproducts (if any) are removed from the reaction space, e.g., by purging with an inert gas. A vacuum generated by a pumping system may also be used in removing excess first reactant and reactant byproducts. Purging gas is preferably any inert gas, including, without limitation, argon (Ar) and helium (He) and, at typical deposition temperatures, hydrogen ($H_2$) and nitrogen ($N_2$).

Maximum step coverage on the workpiece surface is obtained when the first reactant forms no more than about a single molecular layer in each self-limiting pulse. Due to the size of the chemisorbed species and the number of reactive sites, somewhat less than a molecular layer may be deposited in each pulse of the first reactant. Thus, the maximum coverage of first reactant may be less than a molecular layer.

In a second phase of the deposition cycle, a second reactant is pulsed into the reaction space to react with the adsorbed first reactant molecules left on the substrate surface by the preceding pulse. The second reactant may react with the first reactant to produce an elemental thin film or a compound film. Thus, in some embodiments the second reactant contributes one or more species to the growing thin film. For example, the second reactant may be an oxygen, nitrogen or a carbon-contributing compound.

Preferably, in the second phase the second reactant interacts with the molecular layer left by the first reactant. The second reactant is typically not a halide, although in some embodiments it may be. In some embodiments the second reactant comprises a plasma-excited species, wherein the plasma-excited species may include, without limitation, radicals, anions and cations generated from the reactant either in situ (i.e., in the reactor) or externally (i.e., remote plasma generation) and directed into the reaction space.

Excess second source chemical and reaction byproducts, if any, are removed from the reaction space by a purging gas pulse and/or vacuum generated by a pumping system. A phase is generally considered to immediately follow another phase if a purge (i.e., purging gas pulse) or other reactant removal step intervenes.

The phases of the ALD deposition cycle can be repeated as necessary to produce a film of desired composition and thickness. Additional phases can be included as necessary or desired, for example to add additional species to form a ternary or more complex film or to add a dopant to the film. Additional phases may be included in each ALD cycle or at particular intervals in the deposition process (e.g., every second, third, fourth, fifth etc. . . . deposition cycle). The skilled artisan will appreciate that the principles disclosed here can be readily applied to depositing binary, ternary or more complex materials by ALD. For example, an additional metal phase can be included to produce a film comprising two metal species. Thus, additional phases can be added to the cycle to produce a thin film with the desired composition. In other embodiments additional ALD cycles for depositing different materials can be utilized to produce more complex films.

In some embodiments, a gettering agent that is capable of scavenging or gettering corrosive species may be provided in an additional phase. In one embodiment, in addition to acting as a gettering agent the third reactant also provides a species to the thin film, such as carbon. Depending upon the other reactants and deposition conditions, such a gettering agent may be, for example, triethyl boron ("TEB") or triethylaluminum ("TMA"). In other embodiments, a gettering agent, such as diethylsilane ("DES"), is used as a second reactant in combination with a metal reactant, such as $WF_6$, for depositing films containing a metal from the metal reactant and a species from the gettering agent. In the case of $WF_6$ and DES, the resulting film is a $WC_x$ film.

In some embodiments, a reducing agent, such as plasma-excited species of hydrogen generated by, e.g., an in situ or remote plasma generator, is provided (or pulsed) in an additional phase to reduce the deposited film. The reducing agent removes, for example, contaminants such as halogen atoms and/or oxidizing material (e.g., oxygen atoms) deposited in the film and/or the substrate in the second phase. Plasma-excited species of hydrogen include, without limitation, atomic hydrogen (H), hydrogen radicals (H*), hydrogen cations (e.g., $H^+$, $H_2^+$) and hydrogen anions ($H^-$, $H_2^-$). Plasma-excited species of hydrogen may be formed in situ or remotely, for example from molecular hydrogen ($H_2$) or hydrogen-containing compounds (e.g., silane, diborane, etc).

Each ALD deposition cycle may be the same in an ALD process. For example, one deposition cycle may be repeated up to 10, 100, 1000 or even 10000 or more times to produce layers with uniform thicknesses ranging from one or several atomic layers to 1,000 nanometers (nm) or more. The number of cycles can be determined by the skilled artisan given the particular circumstances, including the growth rate (per cycle) of the film and the desired thickness. In some embodiments, the cycle may be repeated until a thin film is formed with a thickness of less than about 100 nanometers (nm), preferably less than about 50 nm, more preferably less than about 30 nm, and most preferably less than about 20 nm. The skilled artisan will appreciate that the thickness of the thin film can vary depending on the particular application. However, in some embodiments the ALD deposition cycles may vary. As an example, to produce a nanolaminate film a first ALD deposition cycle may be alternated at particular intervals with a second ALD deposition cycle.

As an example, for depositing a metallic film to increase the robustness of an NIL template, the thickness is typically from about 3 nm to about 100 nm, preferably from about 5 nm to about 20 nm, depending in part on the film properties, such as the film density. Dense films can generally be thinner. As another example, for controlling adhesion the thickness range is typically from about 0.2 nm to about 10 nm, preferably from about 0.5 nm to about 3 nm. The sub-nanometer thickness of the "films" means that the films may not be continuous, but that instead a surface modification is performed.

Other steps may be included in an ALD process that are not repeated in each deposition cycle. For example, the surface of the template may be treated in an initial step to provide a desired surface termination prior to beginning the first phase of an ALD cycle. In other embodiments, a treatment may be provided at intervals in an ALD process. For example an anneal step may be provided at appropriate intervals to remove contaminants from the growing film. In other embodiments, a growing film may be oxidized at intervals during deposition.

Although referred to as the "first phase," the "second phase" and the "third phase," etc. . . . , these labels are for convenience and do not indicate the actual order of the phases in each ALD cycle. Thus, the initial ALD cycle may be started with any of the phases described above. However, one of skill in the art will recognize that in some embodiments if the initial ALD cycle does not begin with a species contributing phase, such as provision of a metal reactant, at least two ALD cycles will need to be completed to deposit about a molecular layer of the desired thin film. A phase is considered to immediately follow another phase if only a purge or other reactant removal step intervenes.

In preferred embodiments the substrate on which deposition is desired, preferably a NIL template, is loaded into a reactor. The reactor may be part of a cluster tool in which a variety of different processes are carried out. An exemplary reactor is commercially available from ASM America, Inc. (Phoenix, Ariz.) under the tradename Pulsar®.

With reference to FIG. 1, an exemplary embodiment for forming a thin film on an NIL template by an ALD-type process is illustrated.

An NIL template is placed in a reaction space. If necessary, the exposed surfaces of the template are terminated to react with the first phase of the ALD process. The first phase of the preferred embodiment may be reactive, for example, with hydroxyl (—OH) termination or amino (—$NH_x$) termination left by an initial ammonia ($NH_3$) treatment. In some cases a separate termination step is not required.

After initial surface termination, if necessary, a first reactant or source material is supplied or pulsed 102 to the template. In accordance with a preferred embodiment, the first reactant pulse comprises a carrier gas flow and a first reactant, preferably a volatile halide compound that is reactive with the template surfaces of interest. The first reactant comprises a species that is to form part of the thin film, typically a metal or semimetal. Accordingly, the first reactant adsorbs upon the template surfaces. The first reactant pulse 102 self-saturates the template surfaces such that any excess constituents of the first reactant pulse do not further react with the molecular layer formed by this process. Self-saturation is due to ligands, such as halide tails terminating the molecular layer, protecting the layer from further reaction.

The first reactant pulse 102 is preferably supplied in vapor form. The first reactant gas is considered "volatile" for purposes of the present description if the species exhibits sufficient vapor pressure under the process conditions to transport the reactant to the workpiece in sufficient concentration to saturate exposed surfaces. Some reactants can be sufficiently volatile to saturate the substrate under deposition conditions despite being liquid or solid under standard (room temperature and atmospheric pressure) conditions.

After sufficient time to allow a molecular layer of the first reactant to adsorb on the desired template surfaces, excess first reactant is then removed 104 from the reaction space. Preferably, step 104 merely entails stopping the flow of the first reactant or chemistry while continuing to flow a carrier gas (e.g., Ar or $H_2$) for a sufficient time to diffuse or purge excess reactants and reactant byproducts from the reaction space, preferably with greater than about two reaction chamber volumes of the purge gas, more preferably with greater than about three chamber volumes. Preferably, the removal 104 comprises continuing to flow purge gas for between about 0.1 seconds and 20 seconds after stopping the flow of the first reactant. Together, the adsorption 102 and reactant removal 104 represent the first phase 50 in the deposition cycle. The first phase in the illustrated deposition cycle is thus the metal phase.

With continued reference to FIG. 1, a second reactant is pulsed 106 to the workpiece. The second chemistry reacts with or adsorbs upon the molecular layer left by the first reactant. In some embodiments, the second reactant removes ligands from the first reactant adsorbed on the template in step 102. The second reactant pulse 106 also leaves a surface termination that operates to limit the deposition in a self-limiting, saturative reaction phase.

After a time period sufficient for the second reactant to react with the adsorbed first reactant, excess second reactant and any reaction byproducts (preferably also volatile) are removed 108 from the reaction space, preferably by a purge gas. The removal can be as described for step 104. Together, steps 106 and 108 represent a second phase 60 of the illustrated process.

Steps 102-108 may be repeated 110 to form a thin film of a desired thickness. In some embodiments, the first phase is repeated several times prior to the step of providing second reactant.

As mentioned above, the cycle 110 can include only two alternated reactants. In other arrangements, additional chemistries can also be included in each cycle or in various cycles throughout the deposition process. For example, if necessary, the cycle 110 can be extended to include a distinct surface preparation. Moreover, one or more additional phases can be conducted in each cycle. For example, phases may be included that add additional components to the growing thin film.

In practicing the preferred embodiments, the conditions in the reaction space are preferably arranged to minimize gas-phase reactions that can lead to the formation of condensed material. Thus, reactant chemical pathways are preferably kept separate until entering the reaction space. Reactions between species chemisorbed on the surface and a gaseous reactant self-saturate. Reactions between by-products and a gaseous getter, if used, form volatile chemical compounds.

The deposition can be carried out at a wide range of pressure conditions, but it is preferred to operate the process at reduced pressure. The pressure in the reactor is preferably maintained between about 0.01 mbar and 50 mbar, more preferably between about 0.1 mbar and 10 mbar.

The temperature of the template is kept low enough to keep the bonds between thin film atoms below the surface intact and to prevent thermal decomposition of the gaseous source chemicals. On the other hand, the template temperature is kept high enough to provide activation energy for the surface reactions for a thermal ALD process, and high enough to prevent the physisorption of source materials and minimize condensation of gaseous reactants in the reaction space. Depending on the reactants, the temperature of the template is typically about 100° C. to about 750° C., preferably about 200° C. to about 500° C., more preferably about 250° C. to about 450° C.

The temperature of the reactant vapors at their sources is preferably set below the template temperature. This is based on the fact that if the partial pressure of the source chemical vapor exceeds the condensation limit at the template temperature, controlled layer-by-layer growth of the thin film is compromised.

As the growth reactions are based on self-saturated surface reactions, there is no need for setting tight upper boundaries for pulse and purge times. The amount of time available for the pulsing cycle is limited mostly by the economic factors, such as desired throughput of the product from the reactor. Very thin film layers can be formed by relatively few pulsing cycles and in some cases this allows the use of low vapor pressure source materials with relatively long pulse times.

Nanoimprint Lithography

Nanoimprint lithography is a low cost, high throughput and high resolution method of fabricating nanometer scale patterns. Patterns are created by mechanical deformation of an imprint resist using a template, followed by subsequent processing. The imprint resist is typically a monomer or polymer formulation. The imprint resist material may be spun onto a substrate or dispensed onto a substrate by drops. After mechanical deformation using an imprinting template, the resulting pattern is cured, typically by heat or UV light. In other embodiments the imprint is applied to the template directly to form a cast that is transferred to a substrate.

The substrate on which the pattern is to be formed can comprise various types of materials. When manufacturing integrated circuits (ICs), the substrate typically comprises a number of thin films with varying chemical and physical properties. Preferably, at least one surface comprises a metal, semiconductor or semiconductor oxide or nitride. For example, a surface may comprise silicon, polysilicon, SiGe, Ge, GaAs, silicon oxide (e.g., $SiO_2$) or a silicon nitride, such as silicon oxynitride. The substrate may comprise a high-k dielectric layer, a metal layer, and/or a metal nitride. Further, the substrate surface may have been patterned and may comprise structures such as nodes, vias and trenches.

A variety of types of NIL processes are known and several are described in more detail below, including thermal imprint lithography, UV imprint lithography, step and flash imprint lithography (SFIL), transfer imprint lithograph, microcontact printing and self assembly imprinting. One of skill in the art will appreciate that the methods of modifying the surface of the template can be readily adapted to a particular type of NIL and the particular circumstances.

Generally speaking, the template, or mold, is the master copy of the pattern and is used to displace the imprint resist. In addition, because the resist is typically cured while the template is present, the template must also allow the material to be set and then release the resist material during separation. For thermal imprinting processes, the typical molds are nickel films, although other alternative materials can be used, such as silicon and fused silica. Some templates, particularly those used for UV imprinting, are typically transparent in order to pass the UV light used for curing, and are often made from fused silica, although again, other types of materials such as polydimethylsiloxane (PDMS) can be used. PDMS molds can also be used for transfer imprinting as they are able to make molecular contact with the substrate.

In a typical thermal imprinting process (see, for example, Chou 1995), a polymer layer is spun onto the substrate to be patterned. The polymer usually has a glass transition temperature above 50° C. After heating above its Tg, the template is pushed into the polymer. The temperature is then reduced to below the Tg of the polymer and the template is removed. No change in molecular structure occurs during the set. High imprint pressures of about 50 atmospheres are typically used. The imprint material has a low viscosity while having enough mechanical strength that separation of the mold is possible at temperatures below the Tg. Thus, materials with the lowest possible molecular weight while retaining sufficient strength are used. A wide range of different polymers have been used, including methyl or aromatic substituted polymethacrylates. Polymers are available commercially, for example from Microresist Gmbh and Nanonex.

Similarly, UV imprinting or UV nanoimprint lithography (UV NIL) processes typically start with a lower viscosity liquid that just forms stable films at room temperature (See, for example, Haisma, 1996). The spun on polymer layer is imprinted with a template of the desired pattern, generally at lower pressure than in thermal imprinting. UV light is then used to crosslink the polymer layer to create a polymer network with sufficient mechanical strength to allow separation of the template.

Low viscosity monomers that do not form stable films can also be used, for example in Step and Flash Imprint Lithography processes (see, for example, Colburn 1999). The monomers are dispensed as droplets, rather than spun on as a film. A lower imprint pressure (typically less than 0.05 atmospheres) is necessary to produce the desired pattern. Again, a template with the desired pattern is pushed into the monomers, which are polymerized using UV light.

Resist materials which can be used for UV NIL systems, such as acrylates, are available commercially from Microresist Gmbh, Nanonex and Toshio Gosie. Vinyl ether has also been used in drop dispensed systems.

In transfer imprint NIL processes (See, for example, Bao 2002), solvent casting is typically used to create a copy of a template. A polymer is cast on the template, followed by thermal evaporation of the solvent to create a copy of the textured surface of the template. The casting is then transferred to the substrate. Any polymer that can be solvent cast can be utilized. Such polymers are available from Transfer Devices and Liquidia. In addition, thermal and UV imprinting processes can also be used to form a cast of the template. If the substrate already has a pattern, transfer of the cast pattern to the substrate will result in bridge structures.

In a further type of NIL process, also referred to as microcontact printing, a chemical pattern is transferred onto a surface using a template that conforms to the substrate. The raised surface of the template contacts a source of the chemical (or "ink pad") and then contacts the substrate to transfer the chemical (see, for example, Whitesides, 2001). This technique produces a flat, nano-patterned chemical on the substrate surface.

Finally, in some NIL processes objects are first self assembled on the template and then transferred to the substrate (see, for example, Kraus 2005).

Reduced Surface Roughness

Surface roughness of the NIL template can be transferred to the pattern and thus can be a limiting factor in the ability to make ultra small structures by NIL. In some embodiments a thin film is deposited on an NIL template by ALD prior to imprinting in order to improve surface roughness. For example, amorphous oxides, such as, ZnO, $SiO_2$ and $Al_2O_3$ films deposited by using TMA and $H_2O$ or $O_3$ may be used to improve surface smoothness. Improving surface roughness may also facilitate release of the template from the cured pattern. Just few ALD cycles can be enough to improve the surface roughness. As an example, the thickness range of the film or surface modification is typically from about 0.1 nm to about 10 nm, preferably from about 0.2 nm to about 3 nm and more preferably from about 0.5 nm to about 2 nm. Again the sub-nanometer thicknesses of the "films" mean that the films may not be continuous, but instead may be considered a surface modification.

Enhanced Release

As discussed above, it is necessary that the NIL template can be removed from the patterned resist after curing. Thus, the release characteristics of the template and the resist material are important. In some embodiments, the surface of the template is modified so that it will release the cured and patterned resist more easily than an unmodified template. A thin film is deposited on an NIL substrate by ALD, where the thin film makes the adhesion between the template and the polymer of the cured resist weaker.

In some embodiments, if the surface of the polymer is hydrophobic, the surface of the template is modified to be more hydrophilic. For example, thin films of oxides containing OH-groups, such as $Al_2O_3$ and $SiO_2$, may be deposited on the template by an ALD process. One or more ALD cycles can be enough to make the surface hydrophilic. As an example, the thickness range is typically from about 0.1 nm to about 10 nm, preferably from about 0.2 nm to about 3 nm and more preferably from about 0.5 nm to about 2 nm.

In other embodiments, if the surface of the polymer is hydrophilic, the surface of the template is preferably modified to be more hydrophobic. For example, a silylization can make the template more hydrophobic. A thin film comprising silyl ligands, such as hexamethyldisilazane, can be deposited on the template by an ALD process to make the surface more hydrophobic. One or more ALD cycles can be enough to make the surface hydrophilic. In some cases, one pulse of silylization agent such as HMDS can make the surface more hydrophobic.

The ALD process or surface treatment process may comprise forming a functional surface on the substrate. For example, alternately and sequentially exposing the substrate to hexamethyldisilazane ("HMDS") or other aminosilanes or amino silazanes and a second reactant such as water or ozone can produce a more hydrophobic surface.

In yet other embodiments, a functional surface is formed on the polymer by a relatively few cycles of an ALD reaction for depositing a film such as a metal oxide (for example, aluminum oxide from TMA and water or ozone). In some embodiments from about 1-100 cycles are carried out, while in other embodiments about 1-50 cycles are used and in still other embodiments about 1-10 cycles.

Self-assembled monolayers (SAM), such as alkane thiols, alkyl silane, or alkyl carboxylates can subsequently be deposited on an ALD film surface, making the surface hydrophobic. Without the deposited ALD film, such as an aluminum oxide film, the adhesion of SAM's to the substrate may not be sufficient for the desired use. A self-assembled monolayer may be prepared, for example, by adding a solution of the desired molecule onto the substrate surface and washing off the excess. Other methods of forming SAM's are known in the art and include gas phase deposition methods. The skilled artisan will be able to determine a suitable SAM deposition method given the particular circumstances.

Enhanced Robustness

NIL templates are used multiple times to reproduce the desired pattern on one or more substrates. Thus, any deformation can result in imperfect patterning. In some embodiments, the surface of the template is modified to enhance the robustness of the template. For example, a hard metal coating may be deposited on the surface of the template prior to its use in an NIL process. Preferably, an ALD process is utilized, as it allows for conformal deposition on the template, thus maintaining the desired pattern.

For example, the ALD process may comprise alternately and sequentially exposing the substrate to $WF_6$ and DES or disilane to produce a more robust surface comprising $WC_x$ or W.

Anti-Reflective Coating

In some embodiments where UV light is used to cure the patterned resist, the surface of the template is coated with an anti-reflective coating that transmits the desired wavelength(s) of UV light. Preferably, the anti-reflective coating is deposited by an ALD process. Exemplary coatings may be $SiO_2$ and $SiN_x$.

Nanolaminates

In some embodiments a nanolaminate structure is deposited on an NIL template by ALD prior to imprinting. The nanolaminate preferably comprises at least two distinct films. A first film is deposited directly on the template and a second film is deposited over the first film. In some embodiments the second film is deposited directly over the first film, while in other embodiments one or more additional films may be deposited between the first film and the second film. Preferably the materials of the first and second film are selected such that after imprinting, when the template is removed the first film remains adhered to the template surface while the second film remains attached to the polymerized resist. Thus, in one embodiment the second film is selected such that the adhesion between the second film and the imprint resist is greater than the adhesion between the second film and the film that the second film is directly contacting (typically the first film). In other embodiments the adhesion between the first film and the template may be greater than the adhesion between the second film and the first film.

Adjusting the Size of Features

ALD can be used to adjust the size of the features on an NIL template prior to imprinting. For example, if narrower trenches are desired (as may be the case if the limits of the template formation process are reached), ALD can be used to narrow the trenches to a desired thickness by filling the trenches with a material. Currently, templates are made by e-beam lithography, which can produce small features such as trenches, but is an expensive technique. However, if even smaller dimensions than what e-beam lithography can produce are preferred, films can be deposited by ALD to produce ultra-small and complex features. Narrowing the features made by conventional, less expensive lithography techniques by depositing ALD films is a more economical way of producing small features. Thus, in some embodiments trenches in an NIL template are lined with silicon oxide or aluminum oxide by an ALD process. In some embodiments the trenches are lined with a metal. In other embodiments they are lined with a material that can reduce adhesion to the resist material. In still other embodiments the trenches are lined with a material that serves to smooth the template surfaces as well as reduce the width of the trenches.

Forming Metallic Patterns

One of the drawbacks of current NIL techniques is that they can not be used to form metallic patterns. In some embodiments, ALD is used to coat a template made of, for example, one or more polymers, with a metal. The patterned metal is then released from the template and applied to a substrate surface for patterning of the substrate. The template material and metal are selected such that the metal can be released from the template, for example by heat treatment or chemical treatment.

The template can comprise one or more polymer layers with different properties. In some embodiments, heat treatment can release the metal from the template because of different thermal expansion coefficient of the metal and template. Also in some cases heat treatment can produce stress in the interface of the template and a metal film and therefore the metal can be released. Chemical methods include liquefying the outermost layer of the polymer of the template by, for example, radiation or heat treatment, can also be used to release the metal on the substrate. Outer polymer layers of the template can also be burned away by, for example, oxygen, ozone or oxygen plasma and/or combination of heat and plasma.

In some embodiments, a polymer template is alternately and sequentially contacted with a metal source compound, such as a ruthenium source compound and a reducing agent. In the case of noble metals, such as ruthenium, the reducing agent can also comprise oxygen.

In some embodiments the metal precursor comprises one or more metals selected from the group consisting of Cr, Cu, Ni, Fe, Co, Zn, Ru, Rh, Pd, Ag, Re, Os, Ir, Pt, Mo and W. More preferably, the metal particles comprise one or more noble metals. In other embodiments, the metal precursor comprises one or more metals selected from the group consisting of Bi, Mg, Ca, Sr, Rb, Cs, Ba, Ni, Mn, Cu, Co, Ti, Ta, Zr, Hf, V, Nb, Cr, W, Mo, Sc, Y, Lu, La, Ce, Pr, Nd, Pm, Sm, Eu, Gd, Tb, Dy, Ho, Er, Tm, Yb, Fe, Zn, Sn, Sb, Cr, In, Cd, Ga, Ge, B, As, Al, Si, Ru, Rh, Pd, Ag, Re, Os, Ir, Pt, Au, Hg, and Pb. Suitable metal precursors (or source chemicals) may be selected by the skilled artisan.

In some embodiments the metal source chemicals are halides or metalorganic compounds. Preferred metal source chemicals include $TiCl_4$, $TaCl_5$, $HfCl_4$, $ZrCl_4$, $SiCl_4$, $AlCl_3$ trimethylaluminum ("TMA"), $WF_6$, $MoF_6$, $Ru(EtCp)_2$, aminosilanes, such as bis(diethylamino)silane or tris(diethylamino)silane, siloxanes and noble metal betadiketonates, such as iridium, platinum or ruthenium betadiketonates Preferred metal precursors include cyclopentadienyl and betadiketonate metal compounds, more preferably metallocene compounds, beta-diketonate compounds and acetamidinato. Particularly preferred metal precursors are cyclopentadienyl and acetylacetonate (acac) precursor compounds. In some embodiments a bis(ethylcyclopentadienyl) metal compound is used.

When depositing ruthenium thin films, preferred metal precursors may be selected from the group consisting of bis(cyclopentadienyl)ruthenium, tris(2,2,6,6-tetramethyl-3,5-heptanedionato)ruthenium and tris(N,N'-diisopropylacetamidinato)ruthenium(III) and their derivatives, such as bis(N,N'-diisopropylacetamidinato)ruthenium(II) dicarbonyl, bis(ethylcyclopentadienyl)ruthenium, bis(pentamethylcyclopentadienyl)ruthenium and bis(2,2,6,6-tetramethyl-3,5-heptanedionato)(1,5-cyclooctadiene)ruthenium(II). In preferred embodiments, the precursor is bis(ethylcyclopentadienyl)ruthenium ($Ru(EtCp)_2$), 2,4-(dimethylpentadienyl)(ethylcyclopentadienyl)ruthenium ($Ru[(CH_3)_2C_5H_5](EtCp)]$) or bis(2,4-(dimethylpentadienyl)ruthenium ($Ru[(CH_3)_2C_5H_5]_2$).

According to a preferred embodiment, a noble metal thin film is selectively deposited over an NIL template by an ALD type process comprising multiple pulsing cycles, each cycle comprising:

pulsing a vaporized noble metal precursor into the reaction chamber to form a molecular layer of the metal precursor on the first surface of the substrate, purging the reaction chamber to remove excess noble metal precursor and reaction by products, if any, providing a pulse of a second reactant, such as an oxygen, ozone, ammonia or ammonia plasma containing gas onto the substrate, purging the reaction chamber to remove excess second reactant and any gaseous by-products formed in the reaction between the metal precursor layer on the first surface of the substrate and the second reactant, and repeating the pulsing and purging steps until a noble metal thin film of the desired thickness has been formed.

The metal thin film typically comprises multiple monolayers comprising a single metal. However, in other embodiments, the final metal structure may comprise two or more different metals. For example, the growth can be started with the deposition of platinum or iridium and ended with the deposition of ruthenium metal.

Deposition of the metal is continued until the features of the template are filled, preferably completely, with metal. The exposed surface of the deposited metal may be planarized to facilitate adhesion to the substrate.

The deposited metal is then released from the template, for example by a thermal or chemical process as described above and transferred to a substrate where it is used to in further processing.

EXAMPLES

Example 1

A metal film is deposited on a NIL template in an ALD-type process. The sequence of steps includes alternately and sequentially pulsing a metal compound, such as $WF_6$ and a second reactant gas, such as disilane or diborane, into a reaction space comprising the template. The substrate is supported on a susceptor in a Pulsar® reactor (ASM America, Inc.) Deposition is conducted at a substrate temperature of about 150° C. The metal source gas ($WF_6$) is maintained at a temperature of about 20° C. The second reactant, disilane or diborane, is introduced into the reactor at a flow rate of from about 1-100 sccm. The flow rate of the purge gas is held at approximately 400 sccm. The sequence of gas pulses and pulsing times (milliseconds, "ms") is as follows:

(1) metal pulse (1000 ms);
(2) purge (3000 ms);
(3) second reactant pulse (1000 ms); and
(4) purge (3000 ms).

Steps (1)-(4) are repeated approximately 100 times to form a thin film with thickness of about 200 Å, as determined by x-ray reflectometry (XRR).

Example 2

An amorphous oxide film, such as an $Al_2O_3$ film, is deposited on an NIL template in an ALD-type process for smoothing the surface of the NIL template. The sequence of steps includes alternately and sequentially pulsing a metal compound, such as TMA and a second reactant gas, such as water or ozone, into a reaction space comprising the template. The substrate is supported on a susceptor in a Pulsar® reactor (ASM America, Inc. Phoenix, Ariz.) Deposition is conducted at a substrate temperature of about 300° C. The metal source gas TMA is maintained at room temperature (about 20° C.). The second reactant, water or ozone, is introduced into the reactor at a flow rate of from about 10-100 sccm. The flow rate of the purge gas is held at approximately 400 sccm. The sequence of gas pulses and pulsing times (milliseconds, "ms") is as follows:

(1) metal pulse (100 ms);
(2) purge (1000 ms);
(3) second reactant pulse (100 ms); and
(4) purge (1000 ms).

Steps (1)-(4) are repeated approximately 10 times to form a thin film with thickness of about 10 Å, as determined by ellipsometer. The roughness of the template can be considerably less after the deposited amorphous oxide film.

Example 3

A silylization film or treatment is deposited on a NIL template in an ALD-type process for enhancing release from the NIL template. The sequence of steps includes alternately and sequentially pulsing a silylization compound, such as HMDS and a second reactant gas, such as water, into a reaction space comprising the template. The template is supported on a susceptor in a Pulsar® reactor (ASM America, Inc.) Deposition is conducted at a substrate temperature of about 350° C. The metal source gas HMDS is maintained at room temperature (about 20° C.). The second reactant, such as ozone, is introduced into the reactor at a flow rate of from about 10-100 sccm. The flow rate of the purge gas is held at approximately 400 sccm. The sequence of gas pulses and pulsing times (milliseconds, "ms") is as follows:

(1) metal pulse (100 ms);
(2) purge (1000 ms);
(3) second reactant pulse (100 ms); and
(4) purge (1000 ms).

Steps (1)-(4) are repeated approximately 0-4 times and ended by pulsing the HDMS to form a surface with silyl (Si—CH$_3$) groups, which is hydrophobic. A thin film or a surface with silyl group having a thickness of about 0.1-1.0 Å is formed. Releasing the template from the resist is considerably easier after the silylization.

Example 4

An ALD film, preferably a metal oxide film such as Al$_2$O$_3$ is deposited on the surface of an NIL template in an ALD-type process. A metal compound, such as TMA, and a second reactant gas, such as water or ozone, are alternately and sequentially pulsed into a reaction space comprising the template. The substrate is supported on a susceptor in a Pulsar® reactor (ASM America, Inc., Phoenix, Ariz.). Deposition is conducted at a substrate temperature of about 300° C. The metal source gas is maintained at a temperature of about 20° C. The second reactant is introduced into the reactor at a flow rate between about 10-100 sccm. The flow rate of the purge gas is held at approximately 400 sccm. The sequence of gas pulses and pulsing times is as follows:

(1) metal pulse (100 ms);
(2) purge (1000 ms);
(3) second reactant pulse (100 ms); and
(4) purge (1000 ms).

Steps (1)-(4) are repeated approximately 10 times to form a metal oxide (for example Al$_2$O$_3$) thin film with a thickness of about 10 Å. Self-assembled monolayers (SM) are deposited on the surface of the metal oxide film, for example by using alkyl silane compounds, thereby making the surface hydrophobic and allowing for easier release of the template from the resist.

In at least some of the aforesaid embodiments, any element used in an embodiment can interchangeably be used in another embodiment unless such a replacement is not feasible.

It will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. A method for enhancing the ability of a patterned nanoimprint lithography (NIL) template to release from a cured imprint resist comprising growing a metallic thin film on the template by an atomic layer deposition (ALD) process, wherein the ALD process comprises alternately and sequentially contacting the template with a first reactant comprising a metal or semimetal and a second reactant, thereby forming the metallic thin film over the template, wherein the template is formed by patterning prior to growing the thin film on the template.

2. The method of claim 1, further comprising removing any excess first and second reactants and reaction byproducts from the reaction space.

3. The method of claim 1, wherein the thin film is substantially uniform.

4. The method of claim 1, further comprising contacting the template with a reducing agent.

5. The method of claim 1, additionally comprising forming a self-assembled monolayer (SAM) on the template after growth of the thin film on the template by ALD.

6. The method of claim 5, wherein forming a SAM comprises contacting the template with one or more compounds selected from the group consisting of alkane thiols, alkyl silanes and alkyl carboxylates.

7. The method of claim 1, wherein the thin film is from about 0.2 to about 10 nm thick.

8. The method of claim 7, wherein the thin film is from about 0.5 to about 3 nm thick.

9. An atomic layer deposition (ALD) process for growing a metallic thin film over a patterned nanoimprint lithography template, comprising alternately and sequentially contacting a template in a reaction space with vapor phase pulses of:

a first reactant comprising a metal or semimetal such that no more than about one molecular layer of the first reactant adsorbs on an exposed surface of the template; and a second reactant, wherein the template is formed by patterning prior to growing the thin film.

10. The process of claim 9, further comprising removing any first reactant after the vapor phase pulse of the first reactant.

11. The process of claim 10, wherein removing comprises purging the reaction space with a gas selected from the group consisting of argon (Ar), helium (He) and hydrogen (H$_2$).

12. The process of claim 10, wherein removing comprises pumping the reaction space.

13. The process of claim 9, further comprising removing any reaction byproducts after each of said pulses.

14. The process of claim 9, wherein the first reactant comprises at least one metal selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru), and osmium (Os).

15. The process of claim 9, wherein the first reactant comprises a metal compound selected from the group consisting of metal halides and metal organic compounds.

16. The process of claim 15, wherein the first reactant is selected from the group consisting of metal bromides, metal chlorides, metal fluorides and metal iodides.

17. The process of claim 9, wherein the first reactant comprises a metal compound selected from the group consisting of metal dialkylamido and metal cyclopentadienyl compounds.

18. The process of claim 9, further comprising contacting the template with one or more vapor phase pulses of a reducing agent.

19. The process of claim 9, wherein the first reactant is introduced into the reaction space with the aid of a carrier gas.

20. The process of claim 9, wherein the second reactant is selected from the group consisting of water, ozone, oxygen, oxygen radicals, atomic oxygen, ammonia, hydrogen, hydrogen radicals, N2/H2 plasma, silanes, metalorganic compounds, silanes, silazanes and boranes.

21. The method of claim 9, wherein the thin film is an oxide, nitride, carbide, or mixture thereof.

22. The method of claim 9, wherein the thin film serves as a moisture barrier.

23. The method of claim 9, wherein the thin film increases the robustness of the NIL template.

24. The method of claim 23, wherein the thin film is from about 3 nm to about 100 nm thick.

25. The method of claim 9, wherein the thin film is a nanolaminate.

26. A process for forming a nanoimprint lithography template, comprising:
   patterning a substrate to form a nanoimprint lithography template; and
   depositing a nanolaminate thin film over the patterned template by an atomic layer deposition process,
   wherein the atomic layer deposition process comprises at least one deposition cycle in which the substrate is alternately and sequentially contacted with a first reactant comprising a metal or semimetal and a second reactant.

* * * * *

UNITED STATES PATENT AND TRADEMARK OFFICE
CERTIFICATE OF CORRECTION

PATENT NO.          : 9,217,200 B2
APPLICATION NO.     : 11/963448
DATED               : December 22, 2015
INVENTOR(S)         : Haukka et al.

Page 1 of 1

It is certified that error appears in the above-identified patent and that said Letters Patent is hereby corrected as shown below:

Title Page

In column 1 (page 2, item 56) at line 4, Under Other Publications, change "Mechnanical" to --Mechanical--.

In column 1 (page 2, item 56) at line 66, Under Other Publications, change "Critial" to --Critical--.

In the Specification

In column 1 at line 10, After "lithography" insert --.--.

In column 5 at line 4, Change "amino silanes" to --aminosilanes--.

In column 13 at line 11 (approx.), After "betadiketonates" insert --.--.

In the Claims

In column 16 at line 39, In Claim 14, change "rutenium" to --ruthenium--.

Signed and Sealed this
Nineteenth Day of July, 2016

Michelle K. Lee
*Director of the United States Patent and Trademark Office*